(12) United States Patent
Jung

(10) Patent No.: US 9,214,239 B2
(45) Date of Patent: Dec. 15, 2015

(54) SEMICONDUCTOR MEMORY DEVICE, MEMORY SYSTEM INCLUDING THE SAME AND OPERATING METHOD THEREOF

(71) Applicant: SK hynix Inc., Gyeonggi-do (KR)

(72) Inventor: Sung Hyun Jung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 118 days.

(21) Appl. No.: 14/219,838

(22) Filed: Mar. 19, 2014

(65) Prior Publication Data

US 2015/0117129 A1    Apr. 30, 2015

(30) Foreign Application Priority Data

Oct. 25, 2013  (KR) .................. 10-2013-0127772

(51) Int. Cl.
 *G11C 11/56* (2006.01)
 *G11C 16/10* (2006.01)
(52) U.S. Cl.
 CPC .......... *G11C 16/107* (2013.01); *G11C 11/5628* (2013.01); *G11C 11/5621* (2013.01); *G11C 11/5642* (2013.01)

(58) Field of Classification Search
 CPC ........... G11C 11/5628; G11C 11/5642; G11C 11/5621
 USPC .............. 365/185.03, 189.05, 185.29, 185.28
 See application file for complete search history.

(56) References Cited

U.S. PATENT DOCUMENTS

2010/0074011 A1*   3/2010   Kang ................. G11C 11/5628
                                                               365/185.03

FOREIGN PATENT DOCUMENTS

KR       1020110014923       2/2011
KR       1020120098164       9/2012

\* cited by examiner

*Primary Examiner* — Jason Lappas
(74) *Attorney, Agent, or Firm* — IP & T Group LLP

(57) ABSTRACT

A semiconductor memory device includes a memory cell array including a plurality of memory cells, a peripheral circuit suitable for generating program and erase voltages and applying the program and erase voltages to the plurality of memory cells when program and erase operations are performed on the plurality of memory cells, and a control logic suitable for controlling the peripheral circuit unit during the program and erase operations and counting a pulse number of the program and erase voltages to store a resultant count number as status data.

20 Claims, 6 Drawing Sheets

SEMICONDUCTOR MEMORY DEVICE, MEMORY SYSTEM INCLUDING THE SAME AND OPERATING METHOD THEREOF

CROSS-REFERENCE TO RELATED APPLICATION

The present application claims priority to Korean patent application number 10-2013-0127772 filed on Oct. 25, 2013, in the Korean Intellectual Property Office, the entire disclosure of which is incorporated by reference herein.

BACKGROUND

1. Technical Field

Various embodiments of the present invention relate to a semiconductor memory device, a memory system including the same, and an operating method thereof.

2. Related Art

A semiconductor memory device is implemented using a semiconductor such as silicon (Si), germanium (Ge), gallium arsenide (GaAs), or indium phosphide (InP). Semiconductor memory devices may be broadly classified into two categories: volatile memory devices and non-volatile memory devices.

Volatile memory devices may lose stored data when power supply is cut off. Examples of volatile memory devices include a static RAM (SRAM), a dynamic RAM (DRAM), a synchronous DRAM (SDRAM) and the like. The nonvolatile memory device may maintain stored data even when power supply is cut off. Examples of nonvolatile memory devices include a read only memory (ROM), a programmable ROM (PROM), an erasable programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. Flash memories may be broadly classified into two categories: a NOR type and a NAND type.

SUMMARY

Various embodiments of the present invention are directed to a semiconductor memory device capable of improving efficiency in the operation thereof when an interrupt instruction is inputted, a memory system including the same, and an operating method thereof.

One aspect of the present invention provides a semiconductor memory device including a memory cell array including a plurality of memory cells, a peripheral circuit suitable for generating program and erase voltages and applying the program and erase voltages to the plurality of memory cells when program and erase operations are performed on the plurality of memory cells, and a control logic suitable for controlling the peripheral circuit unit during the program and erase operations and counting a pulse number of the program and erase voltages to store a resultant count number as status data.

Another aspect of the present invention provides a memory system including a semiconductor memory device suitable for performing program and erase operations and storing status data through an update during the program and erase operations, and a controller suitable for controlling the semiconductor memory device to perform the program and erase operations in response to instructions, wherein, in response to an interrupt instruction inputted during the program and erase operations, the controller is suitable for determining whether the semiconductor memory device performs the program and erase operations continuously or performs an operation indicated by the interrupt instruction while stopping the program and erase operations based on the status data.

Still another aspect of the present invention provides a method of operating a memory system including performing a program or erase operation by applying a program or erase voltage to a memory cell array in response to a program or erase instruction, counting a number of times the program or erase voltage is applied and storing a resultant count number as status data, during the program or erase operation, determining an extent of progress of the program or erase operation based on the status data in response to an interrupt instruction inputted during the program or erase operation, and determining whether to perform an operation indicated by the interrupt instruction depending on a determined extent of progress of the program or erase operation.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

The advantages and features of the present invention, and methods of achieving them will be described using embodiments of the present invention in detail hereinafter with reference to the accompanying drawings. The present invention may, however, be embodied in different forms and should not be construed as limited to the embodiments set forth herein. That is, the embodiments of the present invention are provided to give a description sufficient to allow those with ordinary skill in the art to implement technical aspects of the present invention with ease.

In the description of the present invention, it will be understood that when it is said that any part is "connected" to another part, it may be "directly connected" to the other part or "indirectly connected" to the other part with one or more elements placed therebetween. It will be further understood that, when it is said that any part "includes" any component, unless specifically stated otherwise, the part may further include other components not excluding the other components.

Figure 1:
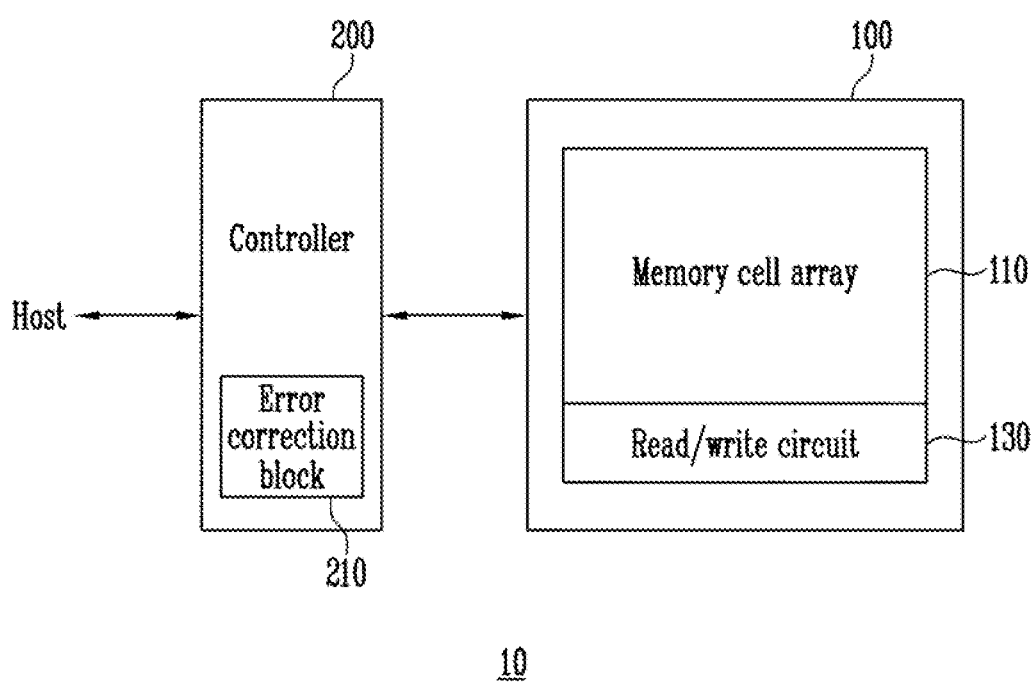
FIG. 1 is a block diagram illustrating a memory system including a semiconductor memory device.

FIG. 1 is a block diagram illustrating a memory system 10 including a semiconductor memory device 100.

Referring to FIG. 1, the memory system 10 includes the semiconductor memory device 100 and a controller 200. The semiconductor memory device 100 includes a memory cell array 110 and a read/write circuit 130 that is connected to the memory cell array 110.

The memory cell array 110 includes a plurality of memory cells. The plurality of memory cells may be defined as a multi-level memory cell that stores at least two bits of data therein.

The semiconductor memory device 100 operates in response to control of a controller 200. The semiconductor memory device 100 may perform a program or erase operation on selected memory cells indicated by an address received along with a program instruction or erase instruction from the controller 200. In addition, when an interrupt instruction is received from a host, the controller 200 controls the semiconductor memory device 100 to output status data indicating information on a processing status of an operation, that is currently underway, to the controller 200. The controller 200 receives the status data to determine whether to proceed with the ongoing operation or to stop the ongoing operation to perform a new operation that is newly inputted in accordance with the interrupt instruction. When the ongoing operation is determined to be performed continuously, the new operation is performed after the ongoing operation is completed. On the other hand, when the ongoing operation is stopped and the new operation is performed in response to the interrupt instruction, the stopped operation may be performed again after the new operation is completed.

Here, as an embodiment of the present invention the semiconductor memory device 100 may be a flash memory device. However, it will be understood that the technical aspects of the present invention are not limited to a flash memory device.

The controller 200 is connected between the semiconductor memory device 100 and the host. The controller 200 may interface between the host and the semiconductor memory device 100. For example, when a program or erase operation is performed in response to a request from the host, the controller 200 may convert a logical block address received from the host into a physical block address, and may provide the semiconductor memory device 100 with the converted physical block address along with a corresponding command. In addition, when the interrupt instruction is received from the host, the controller 200 controls the semiconductor memory device 100 to check the status data and determine a processing order for the interrupt instruction.

As an embodiment, the controller 200 includes an error correction block 210. The error correction block 210 may detect and correct errors of data received from the semiconductor memory device 100. An error correction function performed by the error correction block 210 may be limited depending on the number of error bits out of data received from the semiconductor memory device 100. When the number of error bits out of data received from the semiconductor memory device 100 is smaller than a specific value, the error correction block 210 performs an error detection and correction function. When the number of error bits out of data received from the semiconductor memory device 100 is larger than the specific value, the error detection and correction functions may not be performed.

Figure 2:
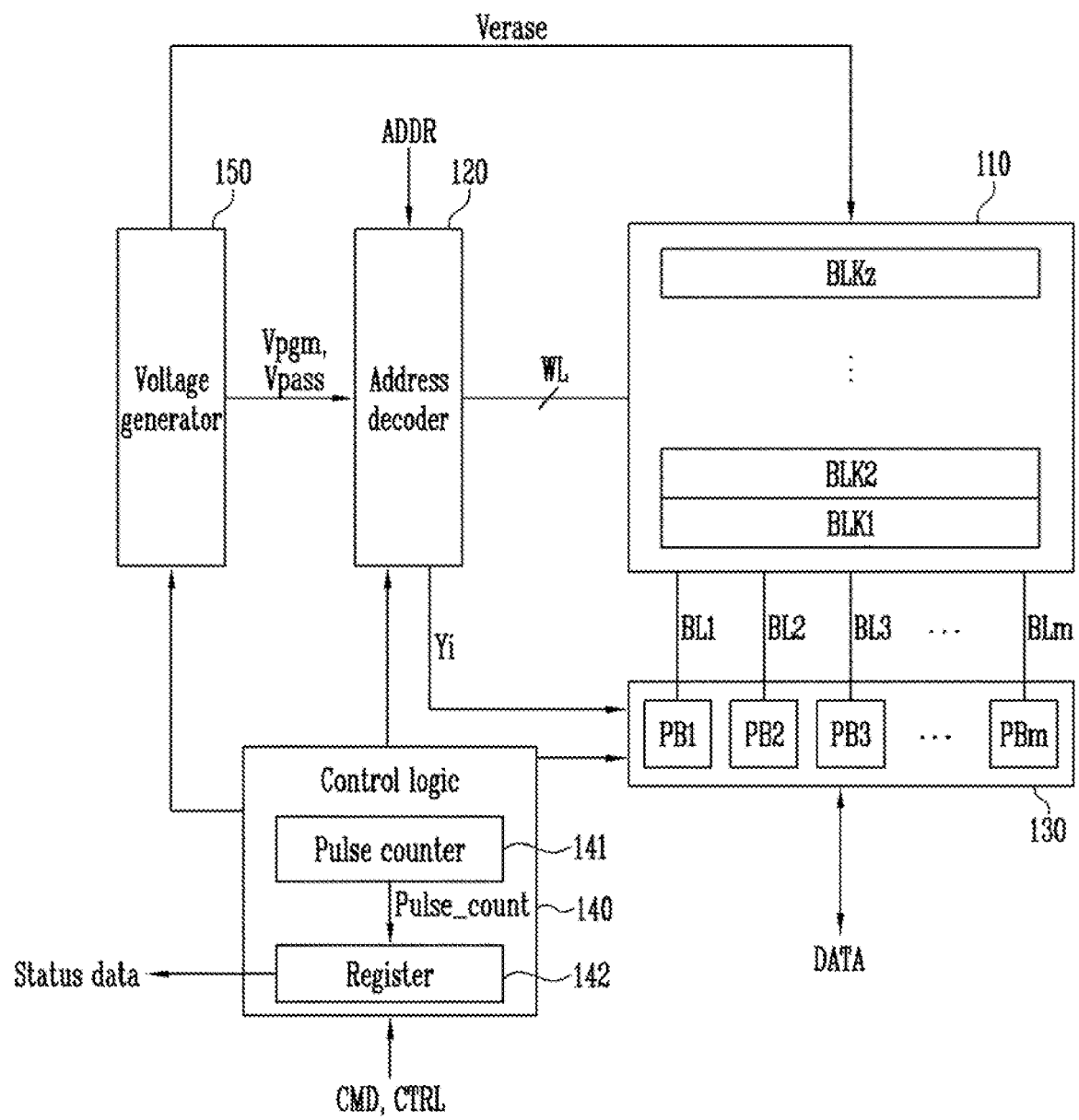
FIG. 2 is a block diagram illustrating the semiconductor memory device of FIG. 1 in detail.

FIG. 2 is a block diagram illustrating the semiconductor memory device 100 of FIG. 1 in detail.

Referring to FIG. 2, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read/write circuit 130 through bit lines BL1 to BLm. Each of the memory blocks BLK1 to BLKz includes a plurality of memory cells. As an embodiment, the plurality of memory cells may be non-volatile memory cells.

The address decoder 120, the read/write circuit 130 and the voltage generator 150 operate as a peripheral circuit that drives the memory cell array 110.

The address decoder 120 is connected to the memory cell array 110 through the word lines WL. The address decoder 120 may operate in response to control of the control logic 140. The address decoder 120 receives an address ADDR through an input/output buffer (not illustrated) in the semiconductor memory device 100. The address ADDR is provided from the controller 200 (refer to FIG. 1).

When a program operation is performed, the address decoder 120 decodes a row address out of received addresses ADDR, applies a program voltage Vpgm generated from the voltage generator 150 to a selected word line out of the plurality of word lines based on the decoded row address, and applies a pass voltage Vpass to the remaining non-selected word lines.

The address decoder 120 may decode a column address out of the received addresses ADDR. The address decoder 120 transmits the decoded column address Yi to the read/write circuit 130.

In the semiconductor memory device 100, the program operation is performed on each page as a basic unit. The addresses ADDR received during a read/write operation include a block address, a row address and a column address. The address decoder 120 selects one memory block and one word line based on the block address and the row address, respectively. The read/write circuit 130 receives the column address, which is decoded by the address decoder 120.

The read/write circuit 130 includes a plurality of page buffers PB1 to PBm. The plurality of page buffers PB1 to PBm are connected to the memory cell array 110 through the bit lines BL1 to BLm. When a program operation is performed, the plurality of page buffers PB1 to PBm temporarily store data to be programmed in the memory cell and control a potential of a corresponding bit line based on the temporarily stored data. In addition, when a program verify operation and an erase verify operation are performed, each of the plurality of page buffers PB1 to PBm performs a verify operation by sensing the potential of the corresponding bit line.

The read/write circuit 130 operates under the control of the control logic 140. As an embodiment, the read/write circuit 130 includes page buffers (or page registers), column selection circuits and the like.

The control logic 140 is connected to the address decoder 120, the read/write circuit 130, and the voltage generator 150. The control logic 140 is configured to control all the related operations of the semiconductor memory device 100 in response to a command CMD and a control signal CTRL received from the controller 200 (refer to FIG. 1).

The control logic 140 includes a pulse counter 141 and a register 142. When the program operation is performed, the pulse counter 141 counts the pulse of the program voltage Vpgm applied to the memory cell array 110, and outputs a pulse counting signal Pulse_count to the register 142. When a erase operation is performed, the pulse counter 141 counts the pulse of an erase voltage Verase applied to the memory cell array 110, and outputs the pulse counting signal Pulse_count to the register 142. The register 142 stores the pulse counting signal Pulse_count received from the pulse counter 141 and data on algorithm steps of program and erase operations as status data, and sends the stored status data to the controller 200 in response to the control signal CTRL inputted from the controller 200 (refer to FIG. 1).

That is, the control logic 140 may control all the related operations of the semiconductor memory device 100 in response to the command CMD and the control signal CTRL received from the controller 200. The control logic 140 sends the status data stored in the register 142 to the controller 200 in response to the control signal CTRL received from the controller 200 when the controller 200 receives an interrupt instruction. The controller 200 receives the status data to determine whether to proceed with the operation that is currently underway or to stop the ongoing operation to perform a new operation that is newly inputted in response to the interrupt instruction, and thus controls the semiconductor memory device 100. When an ongoing operation is performed continuously and completed, a new operation that is newly inputted is performed in response to the interrupt instruction. On the other hand, when the ongoing operation is stopped and a new operation that is newly inputted is performed in response to the interrupt instruction, the stopped operation may be performed again after the new operation is completed.

When the program operation is performed, the voltage generator 150 generates the program voltage Vpgm and the pass voltage Vpass. In addition, when the erase operation is performed, the voltage generator 150 generates the erase voltage Verase. The program voltage Vpgm and the erase voltage Verase are outputted as various types of pulses that gradually rise or fall as a step voltage. That is, when the program operation is performed, the voltage generator 150 sequentially generates a plurality of program voltages, which gradually rise or fall as the step voltage in an incremental step pulse programming (ISPP) method. When the erase operation is performed, the voltage generator 150 sequentially generates a plurality of erase voltages, which gradually rise as the step voltage in an incremental step pulse erase (ISPE) method.

Figure 3:
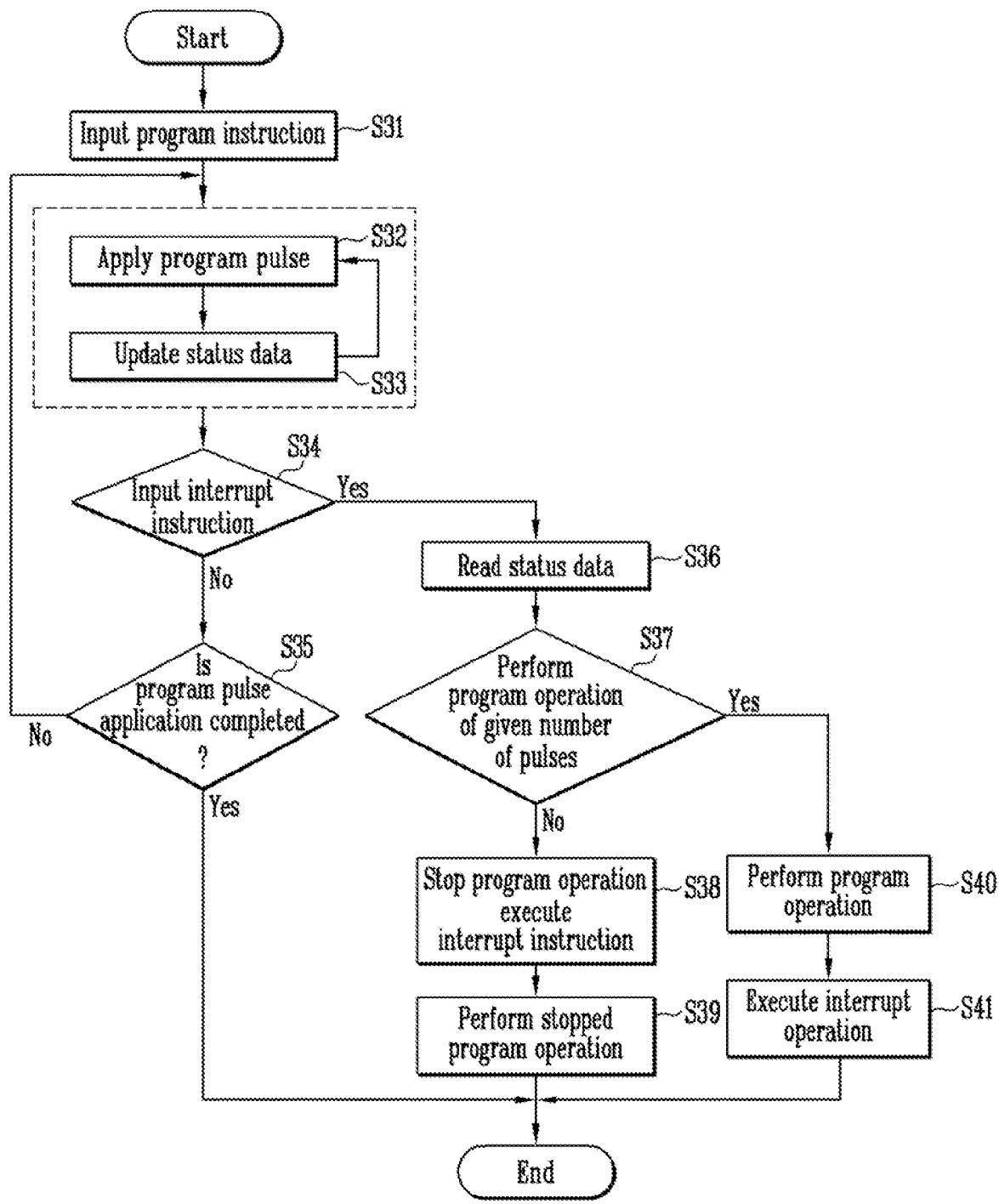
FIG. 3 is a flowchart for describing a program operation of a semiconductor memory device according to an embodiment of the present invention.

FIG. 3 is a flowchart for describing a program operation of the semiconductor memory device according to an embodiment of the present invention.

Referring to FIGS. 1 to 3, the program operation of the semiconductor memory device according to the embodiment of the present invention will be described as follows.

1. Input of Program Instruction (S31)

If a program instruction is inputted from a host, the controller 200 outputs the program instruction to the semiconductor memory device 100.

2. Application of Program Pulse (S32)

The control logic 140 controls peripheral circuits in response to a command CMD received from the controller 200 such that the semiconductor memory device 100 performs a program operation. For example, the read/write circuit 130 temporarily stores data to be programmed, and controls potentials of bit lines BL1 to BLm in response to the data that is temporarily stored. The voltage generator 150 generates a program voltage Vpgm and a pass voltage Vpass, and the address decoder 120 applies the program voltage Vpgm and the pass voltage Vpass to word lines WL of the memory cell array 110. It is desirable that the program operation be processed in an ISPP method.

3. Update of Status Data (S33)

The pulse counter 141 of the control logic 140 counts the pulse number of the program voltage Vpgm that is applied to a selected word line of the memory cell array 110 and generates a pulse count signal Pulse_count when the ISPP operation is performed. The pulse count signal Pulse_count generated in the pulse counter 141 is stored in the register 142 as status data. The status data may include all of the related data of the program operation in addition to the pulse count signal Pulse_count. For example, the status data may include a potential level of the program voltage, and a threshold voltage corresponding to the ongoing program operation.

4. Checking of Interrupt Instruction Input (S34)

While operations of program pulse application (S32) and status data update (S33) described above are performed repeatedly, it is checked whether an interrupt instruction is inputted with a constant time or cycle.

5. Completion of Program Pulse Application (S35)

When the interrupt instruction is not inputted in the interrupt instruction input check step (S34) described above, the program operation of the ISPP method determines whether the program voltage Vpgm that is currently applied is a last program voltage. When the program voltage Vpgm that is currently applied is determined to be the last program voltage, the program operation ends. When the program voltage Vpgm is determined not to be the last program voltage, the program operation may be performed from the program pulse application step (S32) using a new program voltage generated by raising the existing program voltage Vpgm as high as a step voltage.

6. Reading of Status Data (S36)

When the interrupt instruction is determined to be inputted in the interrupt Instruction input check step (S34) described above, the status data stored in the register 142 is outputted to the controller 200.

7. Checking of Program Pulse Number (S37)

The controller 200 reads the status data to determine to what extent the ongoing program operation has been performed. Thus, the program operation is stopped in response to the interrupt instruction to perform a new operation, or the interrupt instruction is put in standby mode until the program operation is performed and completed. For example, when the total number of program pulses in the program operation of the ISPP method is ten and the program operation of the eighth program pulse has been performed, an extent of progress of the program operation is determined to be 80%.

8. Execution of Interrupt Instruction (S38)

When the number of the program pulses described above is checked (S37) and an extent of progress of the ongoing program operation is less than 80%, the program operation is stopped to perform a new operation in response to the interrupt instruction.

9. Performance of Stopped Program Operation (S39)

When a new operation is performed and completed in response to the interrupt instruction, the stopped program operation is performed again to be completed.

10. Performance of Program Operation (S40)

When the number of the program pulses described above is checked (S37) and an extent of progress of the ongoing program operation is 80% or more, the interrupt instruction is put in standby mode until the program operation is completed, and the program operation is performed.

11. Execution of Interrupt Instruction (S41)

After the program operation is performed and completed (S40) as described above, a new operation is performed in response to the interrupt instruction.

According to embodiments of the present invention described above, even when the interrupt instruction is inputted while the program operation is being performed, the status data is received to determine the extent of progress of the program operation that is currently underway. Thus, the interrupt instruction is determined to be executed, or put in standby mode such that the program operation is performed continuously. In this way, efficiency of the semiconductor memory device may be improved.

Figure 4:
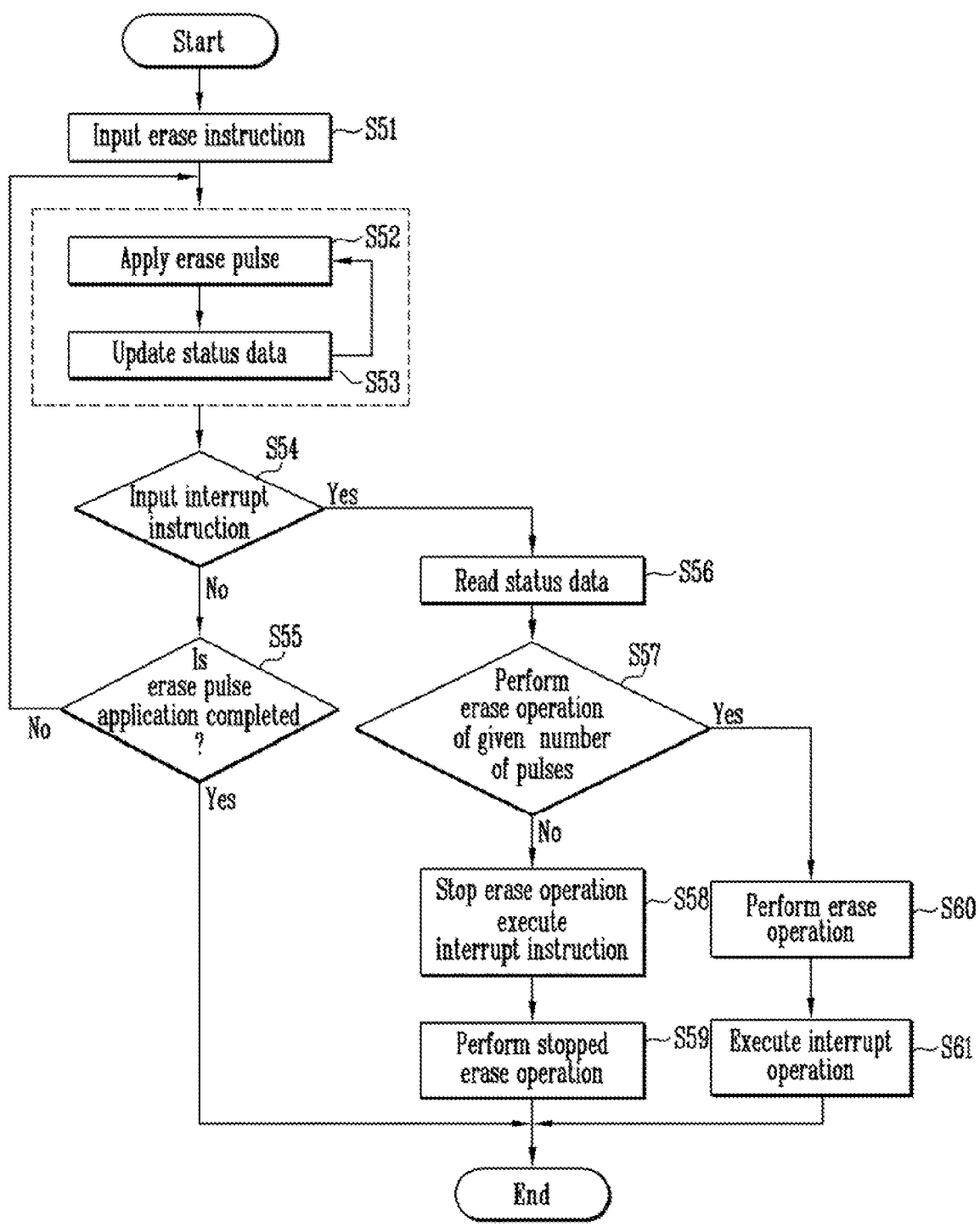
FIG. 4 is a flowchart for describing an erase operation of the semiconductor memory device according to an embodiment of the present invention.

FIG. 4 is a flowchart for describing an erase operation of the semiconductor memory device according to an embodiment of the present invention.

Referring to FIGS. 1, 2 and 4, the program operation of the semiconductor memory device according to the embodiment of the present invention will be described as follows.

1. Input of Erase Instruction (S51)

If an erase instruction is inputted from a host, the controller 200 outputs the erase instruction to the semiconductor memory device 100.

2. Application of Erase Pulse (S52)

The control logic 140 controls peripheral circuits in response to a command CMD received from the controller 200 such that the semiconductor memory device 100 performs an erase operation. For example, the read/write circuit 130 controls potentials of bit lines BL1 to BLm at floating states, and the voltage generator 150 generates an erase voltage Verase, and applies the erase voltage Verase to a semiconductor substrate on which the memory cell array 110 disposed. In this case, it is desirable that the erase operation be processed in an ISPE method.

3. Update of Status Data (S53)

The pulse counter 141 of the control logic 140 counts the pulse number of the erase voltage Verase that is applied to a semiconductor substrate of the memory cell array 110, and thus generates a pulse count signal Pulse_count when the ISPE operation is performed. The pulse count signal Pulse_count generated in the pulse counter 141 is stored in the register 142 as status data. The status data may include all of the related data of the erase operation in addition to the pulse count signal Pulse_count. For example, the status data may include data indicating either a strong erase operation or a soft erase operation, and a potential level of the erase voltage.

4. Checking of Interrupt Instruction Input (S54)

While operations of erase pulse application (S52) and status data update (S53) described above are performed repeatedly, it is checked whether an Interrupt instruction is inputted with a constant time or cycle.

5. Completion of Erase Pulse Application (S55)

When the interrupt instruction is not Inputted in the interrupt instruction input check step (S54) described above, the erase operation of the ISPE method determines whether the erase voltage Verase that is currently applied is a last erase voltage. When the erase voltage Verase that is currently applied is determined to be the last erase voltage, the erase operation ends. When the erase voltage Verase is determined not to be the last erase voltage, the erase operation may be performed from the erase pulse application step (S52) using a new erase voltage generated by raising the existing erase voltage Verase as high as a step voltage.

6. Reading of Status Data (S56)

When the interrupt instruction is determined to be inputted in the interrupt instruction input check step (S54) described above, the status data stored in the register 142 is outputted to the controller 200.

7. Checking of Erase Pulse Number (S57)

The controller 200 reads the status data to determine to what extent the ongoing erase operation has been performed. Thus, the erase operation is stopped in response to the interrupt instruction to perform a new operation or the interrupt instruction is put in standby mode until the ongoing erase operation is performed and completed. For example, when the total number of erase pulses in the erase operation of the ISPE method is ten and the erase operation of the eighth erase pulse has been performed, an extent of progress of the erase operation is determined to be 80%.

8. Execution of Interrupt Instruction (S58)

When the number of erase pulses described above is checked (S57) and an extent of progress of the ongoing erase operation is less than 80%, the erase operation is stopped to perform a new operation in response to the interrupt instruction.

9. Performance of Stopped Erase Operation (S59)

When a new operation is performed and completed in response to the interrupt instruction, the stopped erase operation is performed again and completed.

10. Performance of Erase Operation (S60)

When the number of erase pulses described above is checked (S57) and an extent of progress of the ongoing erase operation is 80% or more, the interrupt instruction is put in standby mode until the erase operation completed, and the erase operation is performed.

11. Execution of Interrupt Instruction (S61)

After the erase operation is performed and completed (S60) as described above, a new operation is performed in response to the interrupt instruction.

According to embodiments of the present invention described above, even when the interrupt instruction is inputted while the erase operation is performed, the status data is received to determine the extent of progress of the ongoing erase operation. Thus, the interrupt instruction is determined to be executed, or put in standby mode such that the ongoing erase operation is performed continuously. In this way, efficiency of the semiconductor memory device may be improved.

Figure 5:
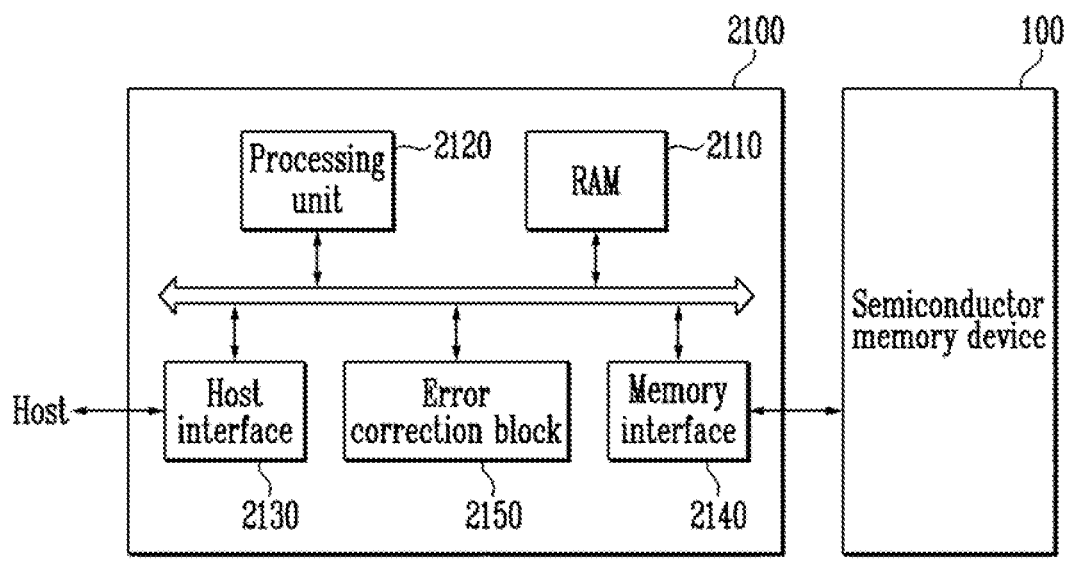
FIG. 5 is a block diagram illustrating a memory system including the semiconductor memory device of FIG. 1.

FIG. 5 is a block diagram illustrating a memory system including the semiconductor memory device of the FIG. 1.

Referring to FIG. 5, a memory system 2000 includes a semiconductor memory device 100 and a controller 2100. The semiconductor memory device 100 may be configured and operated in the same way as illustrated with reference to FIG. 2.

The controller 2100 includes a function of the controller 200 illustrated with reference to FIG. 1. The controller 2100 may be connected to a host and the semiconductor memory device 100. The controller 2100 may access the semiconductor memory device 100 in response to a request from the host. For example, the controller 2100 may control write, read, erase, and background operations of the semiconductor memory device 100. The controller 2100 may provide an interface between the semiconductor memory device 100 and the host. The controller 2100 may drive firmware to control the semiconductor memory device 100. In addition, when the interrupt instruction is inputted, the controller 2100 receives status data stored in the semiconductor memory device 100, and determine whether to perform an ongoing operation or to stop the ongoing operation to perform a new operation that is newly inputted in response to the interrupt instruction. When the ongoing operation is performed continuously, the new operation is performed after the ongoing operation is completed. On the other hand, when the ongoing operation is stopped and the new operation is performed in response to the Interrupt instruction, the stopped operation may be performed again after the new operation is completed.

The controller 2100 includes a random access memory (RAM) 2110, a processing unit 2120, a host interface 2130, a memory interface 2140, and an error correction block 2150. The RAM 2110 is used as at least one out of an operation memory of the processing unit 2120, a cache memory between the semiconductor memory device 100 and the host, and a buffer memory between the semiconductor memory device 100 and the host. The processing unit 2120 controls all the related operations of the controller 2100. In addition, the controller 2100 temporarily stores program data provided from the host when a program operation is performed.

The host interface 2130 includes a protocol to perform data exchange between the host and the controller 2100. As an exemplary embodiment, the controller 1200 may communicate with the host through at least one of various interface protocols such as Universal Serial Bus (USB) protocol, MultiMediaCard (MMC) protocol, Peripheral Component Interconnect (PCI) protocol, PCI-Express (PCI-E) protocol, Advanced Technology Attachment (ATA) protocol, Serial-ATA protocol, Parallel-ATA protocol, Small Computer System Interface (SCSI) protocol, Enhanced Small Disk Interface (ESDI) protocol, Integrated Drive Electronics (IDE) protocol, and a private protocol.

The memory interface 2140 interfaces with the semiconductor memory device 100. For example, the memory interface 2140 includes a NAND interface or NOR interface.

The error correction block 2150 performs the same function as the error correction block 210 of FIG. 1. The error correction block 2150 may detect and correct errors in data received from the semiconductor memory device 100 using error correction code (ECC). The processing unit 2120 controls the semiconductor memory device 100 such that a read voltage is adjusted to perform a re-read operation based on an error detection result of the error correction block 2150.

The controller 2100 and the semiconductor memory device 100 may be integrated into one semiconductor device. For example, the controller 2100 and the semiconductor memory device 100 are integrated into one semiconductor device to form a memory card such as a PC Card (Personal Computer Memory Card International Association (PCMCIA) card), a CompactFlash (CF) card, a SmartMedia card (SM, SMC), a Memory Stick, an MMC (MMC, RS-MMC, MMCmicro), an SD card (SD, miniSD, microSD, SDHC), a Universal Flash Storage (UFS), etc.

The controller 2100 and the semiconductor memory device 100 may be integrated into one semiconductor device to form a solid state drive (SSD). The SSD includes a storage device that may store data in the semiconductor memory. When the memory system 2000 is used as the SSD, the operation speed of the host connected to the memory system 2000 may be dramatically improved.

As another example, the memory system 1000 is provided as one of components of electronic devices such as a computer, an Ultra-Mobile PC (UMPC), a workstation, a net-book, a Personal Digital Assistant (PDA), a portable computer, a web tablet, a wireless phone, a mobile phone, a smartphone, an e-book, a Portable Multimedia Player (PMP), a portable game console, a navigation device, a black box, a digital camera, a 3-dimensional television set, a digital audio recorder, a digital audio player, a digital picture recorder, a digital picture player, a digital video recorder, a digital video player, a device capable of sending/receiving information under a wireless environment, one of a variety of electronic devices configuring a home network, one of a variety of electronic devices configuring a computer network, one of a variety of electronic devices configuring a telematics network, an RFID device, or one of various components configuring a computing system.

As an exemplary embodiment, the semiconductor memory device 100 or the memory system 2000 may be mounted in various forms of packages. For example, the semiconductor memory device 100 or the memory system 2000 may be mounted and packaged in a type such as a package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP), or wafer-level processed stack package (WSP) type.

Figure 6:
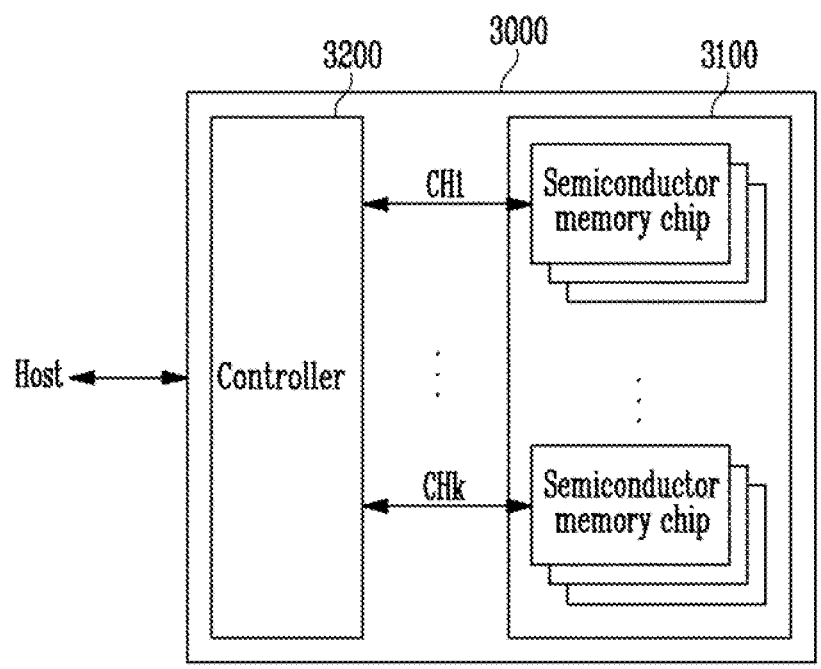
FIG. 6 is a block diagram illustrating an application example of the memory system of FIG. 5.

FIG. 6 is a block diagram Illustrating an application example 3000 of the memory system 2000 of FIG. 5.

Referring to FIG. 6, the memory system 3000 includes a semiconductor memory device 3100 and a controller 3200. The semiconductor memory device 3100 includes a plurality of semiconductor chips. The plurality of semiconductor memory chips are divided as a plurality of groups.

In FIG. 6, the plurality of groups are illustrated as communicating with the controller 3200 through first to $k^{th}$ channels CH1 to CHk, respectively. Each of the semiconductor memory chips is configured and operated the same as the semiconductor device 100 illustrated with reference to FIG. 2.

Each group may communicate with the controller 3200 through one common channel. The controller 3200 is configured the same as the controller 2100 illustrated with reference to FIG. 5, and may control the plurality of memory chips of the semiconductor memory device 3100 through the plurality of channels CH1 to CHk.

In FIG. 6, one channel is described as being connected to the plurality of memory chips. However, it may be understood that the memory system 3000 is transformed such that one semiconductor memory chip is connected to one channel.

Figure 7:
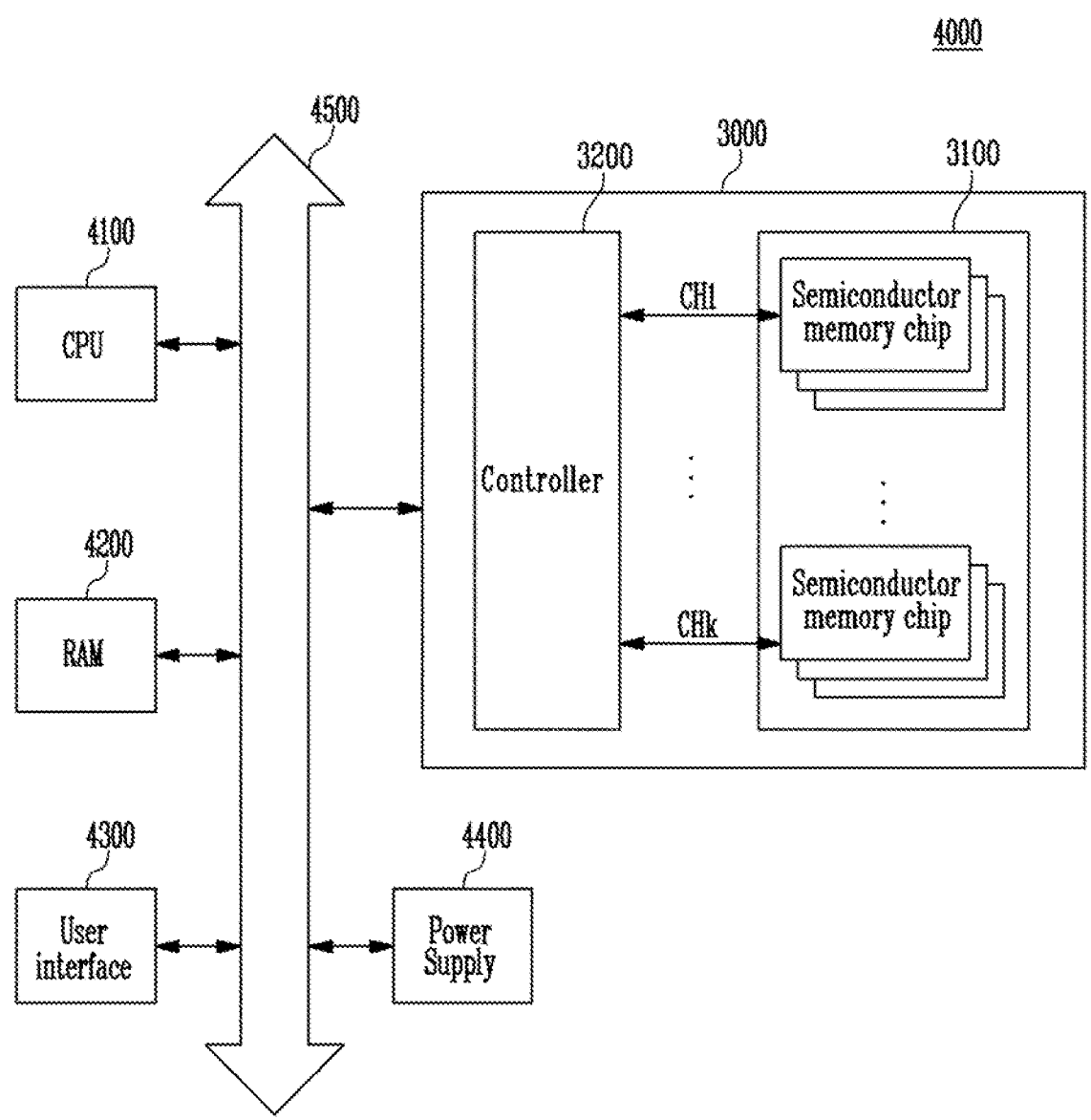
FIG. 7 is a block diagram illustrating a computing system including a memory system described with reference to FIG. 6.

FIG. 7 is a block diagram illustrating a computing system 4000 including the memory system 3000 described with reference to FIG. 6.

Referring to FIG. 7, the computing system 400 includes a central processing unit 4100, a RAM 4200, a user interface 4300, a power supply 4400, a system bus 4500, and a memory system 3000.

The memory system 3000 is electrically connected to the central processing unit 4100, the RAM 4200, the user interface 4300, and the power supply 4400 through the system bus 4500. Data, which is provided through the user interface 4300 or processed by the central processing unit (CPU) 4100, is stored in the memory system 3000.

In FIG. 6, the semiconductor memory device 3100 is illustrated to be connected to the system bus 4500 through the controller 3200. However, the semiconductor memory device 3100 may be directly connected to the system bus 4500. In this case, the central processing unit 4100 and the RAM 4200 may perform a function of the controller 3200.

The memory system 3000 illustrated with reference to FIG. 6 is provided in FIG. 7. However, the memory system 3000 may be replaced with the memory system 2000 illustrated with reference to FIG. 5. As an exemplary embodiment, the computing system 4000 may include the memory systems 2000 and 3000 illustrated with reference to FIGS. 6 and 5.

According to an exemplary embodiment of the present invention, a semiconductor memory device may efficiently operate by determining a progressing state of a program or erase operation by a status read operation when an interrupt instruction is inputted while the program or erase operation is performed.

It will be apparent to those skilled in the art that various modifications can be made to the above-described embodiments of the present invention without departing from the spirit or scope of the present invention. Thus, it is intended that the present invention covers all such modifications provided they come within the scope of the appended claims and their equivalents.

What is claimed is:

1. A semiconductor memory device, comprising:
 a memory cell array including a plurality of memory cells;
 a peripheral circuit suitable for generating program and erase voltages and applying the program and erase voltages to the plurality of memory cells when program and erase operations are performed on the plurality of memory cells; and
 a control logic suitable for controlling the peripheral circuit unit during the program and erase operations and counting a pulse number of the program and erase voltages to store a resultant count number as status data.

2. The semiconductor memory device according to claim 1, wherein the control logic includes:
 a pulse counter suitable counting the pulse number of the program and erase voltages; and
 a register suitable for storing the resultant count number counted by the pulse counter as the status data.

3. The semiconductor memory device according to claim 2, wherein the register stores a pulse potential level of the program and erase voltages, a threshold voltage of the memory cells by the program operation, and a detailed operation step of the erase operation as the status data in addition to the resultant count number counted by the pulse counter.

4. The semiconductor memory device according to claim 1, wherein, when an interrupt instruction is inputted while the program or erase operation is performed, the control logic outputs the status data to the outside.

5. The semiconductor memory device according to claim 1, wherein the status data is data for determining an extent of progress of the program or erase operation performed by the semiconductor memory device.

6. The semiconductor memory device according to claim 1, wherein the peripheral circuit includes:
 a voltage generator suitable for generating the program and erase voltages; and
 a read/write circuit suitable for controlling a bit line potential of the memory cell array.

7. The semiconductor memory device according to claim 4, wherein, depending on the status data, the semiconductor memory device performs the program or erase operation continuously or performs new operation while stopping the program or erase operation in response to the interrupt instruction.

8. A memory system, comprising:
 a semiconductor memory device suitable for performing program and erase operations and storing status data through an update during the program and erase operations; and
 a controller suitable for controlling the semiconductor memory device to perform the program and erase operations in response to instructions,
 wherein, in response to an interrupt instruction inputted during the program and erase operations, the controller is suitable for determining whether the semiconductor memory device performs the program and erase operations continuously or performs an operation indicated by the interrupt instruction while stopping the program and erase operations based on the status data.

9. The memory system according to claim 8, wherein, when the controller determines that the program and erase operations performed by the semiconductor memory device progress to a set extent or more based on the status data, the operation indicated by the interrupt instruction is put in a standby mode and the program and erase operations are performed continuously.

10. The memory system according to claim 8, wherein, when the controller determines that the program and erase operations performed by the semiconductor memory device progress less than a predetermined extent based on the status data, the program and erase operations are stopped and the operation indicated by the interrupt Instruction is performed.

11. The memory system according to claim 8, wherein the semiconductor memory device includes:
 a memory cell array including a plurality of memory cells;
 a peripheral circuit suitable for generating program and erase voltages and applying the program and erase voltages to the plurality of memory cells when the program and erase operations are performed on the plurality of memory cells; and
 a control logic suitable for controlling the peripheral circuit unit during the program and erase operations and counting a pulse number of the program and erase voltages to store a resultant count number as the status data.

12. The memory system according to claim 11, wherein the control logic includes:
 a pulse counter suitable for counting the pulse number of the program and erase voltages; and
 a register suitable for storing the resultant count number counted by the pulse counter as the status data.

13. The memory system according to claim 12, wherein the register stores a pulse potential level of the program and erase voltages, a threshold voltage of the memory cells by the program operation, and a detailed operation step of the erase operation in addition to the resultant count number counted by the pulse counter.

14. The memory system according to claim 11, wherein, when the interrupt instruction is inputted while the program or erase operation is performed, the control logic outputs the status data to the controller.

15. The memory system according to claim 8, wherein the status data is data for determining an extent of progress of the program or erase operation performed by the semiconductor memory device.

16. A method of operating a memory system, comprising:
 performing a program or erase operation by applying a program or erase voltage to a memory cell array in response to a program or erase instruction;
 counting a number of times the program or erase voltage is applied and storing a resultant count number as status data, during the program or erase operation;
 determining an extent of progress of the program or erase operation based on the status data in response to an interrupt instruction inputted during the program or erase operation; and
 determining whether to perform an operation indicated by the interrupt instruction depending on a determined extent of progress of the program or erase operation.

17. The method according to claim 16, wherein, when the status data indicates that the program or erase operation progresses to a predetermined extent or more the operation indicated by the interrupt instruction is put in a standby mode and the program or erase operation is performed continuously.

18. The method according to claim 16, wherein, after the program or erase operation is completed, the operation indicated by the interrupt instruction is performed.

19. The method according to claim 16, wherein, when the status data Indicates that the program or erase operation progresses less than a predetermined extent, the program or erase operation is stopped and the operation indicated by the interrupt instruction is performed.

20. The method according to claim 19, wherein a stopped program or erase operation is performed again after the operation indicated by the interrupt instruction is completed.

* * * * *